(12) United States Patent
Guenther et al.

(10) Patent No.: US 7,502,699 B2
(45) Date of Patent: Mar. 10, 2009

(54) SYSTEM AND METHOD FOR MONITORING POWER IN A FRONT END RECTIFIER POWER SYSTEM

(75) Inventors: Robert A. Guenther, Pepperell, MA (US); Raoji Patel, Round Rock, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 665 days.

(21) Appl. No.: 11/193,689

(22) Filed: Jul. 29, 2005

(65) Prior Publication Data

US 2007/0027645 A1 Feb. 1, 2007

(51) Int. Cl.
G01R 27/00 (2006.01)
G06F 11/00 (2006.01)

(52) U.S. Cl. .......................... 702/61; 702/62; 702/188; 702/189; 361/65

(58) Field of Classification Search ............. 702/61–68, 702/182, 183, 188, 189, 78; 324/142, 149; 361/436, 65; 363/21.12
See application file for complete search history.

(56) References Cited

U.S. PATENT DOCUMENTS 4,500,870 A 2/1985 Krohn et al.
7,298,135 B2 * 11/2007 Briese et al. ................. 324/142

* cited by examiner

*Primary Examiner*—Eliseo Ramos Feliciano
*Assistant Examiner*—Phuong Huynh

(57) ABSTRACT

A system and method for determining power use in a system are disclosed. Briefly described, one embodiment of a method comprises metering power flow into a metered front end rectifier system using a metering circuit residing in the metered front end rectifier system and coupled to an alternating current (AC) power source, determining information corresponding to the metered power flow and communicating the determined metered power flow information to a user interface.

16 Claims, 6 Drawing Sheets

US 7,502,699 B2

SYSTEM AND METHOD FOR MONITORING POWER IN A FRONT END RECTIFIER POWER SYSTEM

TECHNICAL FIELD

Embodiments are generally related to intermediate direct current (DC) power networks and, more particularly, are related to a system and method for monitoring power through front end rectifier devices.

BACKGROUND

Centralized electronic systems, such as a communication network system or a parallel computer processing system, employ a variety of electronic devices residing in a housing or other suitable enclosure. One type of electronic device included in such systems is the front end rectifier.

The front end rectifier converts alternating current (AC) power into an intermediate direct current (DC) power/current/voltage. Power is received from the AC distribution system, which may be, for example, provided at 120 volts AC or 240 volts AC. An electronic rectifying device residing in the front end rectifier converts the received AC power (AC current and AC voltage) into DC power (DC current and DC voltage). Intermediate DC voltage may be, for example, at 48 volts or 12 volts DC, though any suitable intermediate DC voltage may be used depending upon the system design.

Intermediate DC power/current/voltage is used to provide power to individual devices in the electronic system. However, the electronic devices typically require a different DC voltage for operation, so further DC/DC voltage transformation is required, performed by a DC/DC converter output module. The total amount of DC power required by the electronic system is determined, in part, by the loading requirements of all components in the system.

Determining power consumption in the front end rectifier(s), the DC/DC converter output modules and the electronic devices is problematic. Typically, actual energy and demand, in the aggregate or for individual components residing in the enclosure, cannot be determined because such information is not metered. Rather, estimates of energy and demand are used. Such estimates may be based upon known design parameters and/or prior testing of similar devices. However, estimations do not provide precise or reliable information on the actual energy and demand of individual components residing in the enclosure.

Alternatively, an external metering system may be coupled between the enclosure and the AC power supply such that actual energy and demand are monitored on a real time basis. However, this technique may not provide information regarding actual energy and demand by individual components residing in the enclosure. And, with the metering equipment being outside of the enclosure, it may be subject to accidental damage, theft or the like.

One significant problem encountered with conventional electronic systems is that the size, orientation and location of individual components residing in the enclosure are based upon tight design tolerances. That is, components are designed to closely fit next to each other so that a minimum amount of enclosure space is required. Accordingly, it is very difficult to later add metering equipment, and their associated connections, to meter energy and demand within the enclosure. Furthermore, later addition of metering equipment may raise safety and reliability issues. For example, connecting meter leads to components in the enclosure may be dangerous for the test personnel. Also, if an accident were to happen, equipment within the enclosure may become damaged. It is possible that the entire electric system may become inoperable.

Another significant problem relating to the ability to accurately monitor and/or determine actual energy and demand is that in some enclosures, multiple front end rectifiers are used to convert the AC power into DC power. When multiple front end rectifiers are coupled in parallel to the AC power system, actual loading through individual front end rectifiers is not precisely known. For example, slight variations in impedances between individual front end rectifiers will result in imbalanced loading conditions. That is, a slightly lower impedance front end rectifier may be more heavily loaded than a higher impedance front end rectifier. Minor impedance differences may occur between identical models of front end rectifiers. Or, impedance differences may arise if different models of front end rectifiers are used, especially if the front end rectifiers are manufactured by different vendors using different design criteria and different components.

Or, if the front end rectifiers operate with similar components, such as when identical models are used, slight loading imbalances may still occur due to the inherent differences resulting from manufacturing tolerances of individual elements in the control system. Thus, precise determination of actual power (energy and/or demand) flowing through individual front end rectifiers can not be made even if identical front end rectifiers are used in the enclosure.

Additionally, various types of electronic systems have complex processing systems. One example is a server system that employs a memory system for control of switching devices. Various control algorithms used by the server processors to access the memory system are based upon memory access control algorithms. These memory access control algorithms can be adjustable or modifiable to change the type of memory access and/or the frequency of memory access by the processors.

Accordingly, changes or modifications to the memory access control algorithms may change power consumption within the server system. However, outside of lab conditions where bench testing and power metering is easy to implement, determining changes in power consumption when the memory access control algorithms are changed or modified in the field is very difficult.

Furthermore, various design changes, component changes and/or control algorithm adjustments may be made to other components of a server system over time. For example, the vendor of a selected component might be changed such that earlier models of the server system have the selected component from the first vendor, and later models have the selected component from the later vendor. Or, the design engineer may want to make adjustments to the control algorithms and would like to know the impact of the changes in energy and/or demand. Accordingly, it would be very beneficial to have a convenient and accurate way to monitor changes in energy and demand in an individual front end rectifier and in a server system.

SUMMARY

One embodiment includes a system comprising a metered front end rectifier system, the metered front end rectifier system further comprising an alternating current to direct current (AC/DC) rectifier coupled to an AC power source that converts received AC power to DC power at a rectified DC voltage, a modular direct current to direct current (DC/DC) conversion unit coupled to the AC/DC rectifier and to an intermediate DC voltage bus that converts power received at the rectified DC voltage to an intermediate DC voltage, and a meter circuit configured to meter power flowing from the AC power source to the AC/DC rectifier; a memory system that stores information pertaining to the operation of the system; at least one processing system coupled to the memory system, wherein the processing system accesses the memory system using a modifiable memory access control algorithm which controls memory access functions; and a power controller unit coupled to the processing system and the metered front end rectifier system, wherein information corresponding to the metered power is communicated to the power controller unit from the metered front end rectifier system, and wherein the power controller unit adjusts operation of the processing system based upon the received metered power information to either increase power use or decrease power use based upon a predefined value of consumed power.

Another embodiment is a method for determining power use in a system, comprising metering power flow into a metered front end rectifier system using a metering circuit residing in the metered front end rectifier system and coupled to an alternating current (AC) power source, determining information corresponding to the metered power flown and communicating the determined metered power flow information to a user interface.

Another embodiment is a metered front end rectifier system, comprising an alternating current to direct current (AC/DC) rectifier coupled to an AC power source that converts received AC power to DC power at a rectified DC voltage, a modular direct current to direct current (DC/DC) conversion unit coupled to the AC/DC rectifier and to an intermediate DC voltage bus that converts power received at the rectified DC voltage to an intermediate DC voltage, and a meter circuit configured to meter power flowing from the AC power source to the AC/DC rectifier.

BRIEF DESCRIPTION OF THE DRAWINGS

The components in the drawings are not necessarily to scale relative to each other. Like reference numerals designate corresponding parts throughout the several views.

DETAILED DESCRIPTION

Figure 1:
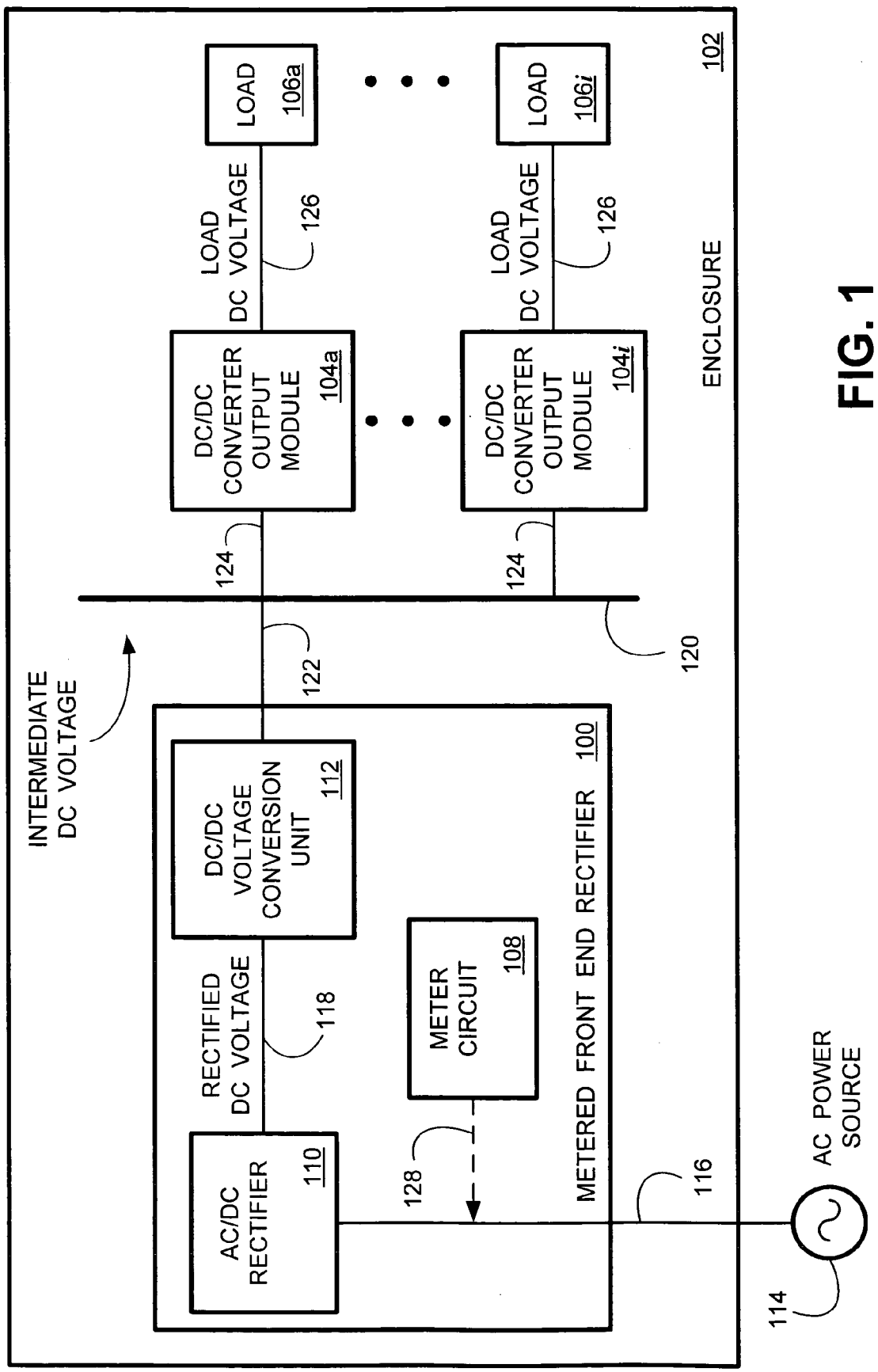
FIG. 1 is a block diagram illustrating an embodiment of a metered front end rectifier residing in an enclosure with other devices.

FIG. 1 is a block diagram illustrating an embodiment of a metered front end rectifier system 100 (herein, also metered front end rectifier 100) residing in an enclosure 102 with other devices, such as a plurality of DC/DC converter output modules 104*a-i* and a plurality of electronic devices 106*a-i*. The metered front end rectifier 100 comprises a meter circuit 108, an alternating current to direct current (AC/DC) rectifier 110 and a direct current to direct current (DC/DC) voltage conversion unit 112.

The metered front end rectifier 100 receives AC power/current/voltage from an alternating current (AC) power source 114, via connection 116. Connection 116 is illustrated as a single line for convenience, and may be a plurality of wire connections depending upon the nature of the AC power source 114. For example, if three phase power is provided by the AC power source 114, connection 116 would be comprised of three wires, one for each phase.

The received AC power is converted to DC power/current/voltage by the AC/DC rectifier 110. The DC voltage corresponds to the voltage of the AC power source, and is referred to as the rectified DC voltage. The rectified DC voltage is provided to the DC/DC voltage conversion unit 112, via connection 118.

The DC/DC voltage conversion unit 112 converts the received rectified DC voltage into an intermediate DC voltage. The intermediate DC voltage is provided to the intermediate DC voltage bus 120, via connection 122.

DC power/current/voltage, at the intermediate DC voltage, is then provided to a plurality of DC/DC converter output modules 104*a-i*, via connections 124. The DC/DC converter output modules 104*a-i* convert the received intermediate DC voltage into the load DC voltage required by the loads 106*a-i*. Thus, the source loads 106*a-i* receive their DC power/current/voltage via connections 126. The loads 106*a-i* correspond to one or more of the electronic devices residing in the electronic system.

An exemplary power supply system is illustrated and described in U.S. patent application Ser. No. 09/753,056 to Brooks et al., published as publication 2002/0085399, which is incorporated by reference herein in its entirety. Accordingly, selected components of the metered front end rectifier 100, the AC/DC rectifier 110, the DC/DC voltage conversion unit 112, the DC/DC converter output modules 104*a-i* and the loads 106*a-i* are not described in detail herein. Furthermore, various other configurations of front end rectifiers are known that provide the same or similar functionality.

As a simplified illustrative example, assume that the metered front end rectifier 100 receives three phase, 120 volt AC power. The AC/DC rectifier 110 converts the received 120 volt AC power into a rectified DC voltage that corresponds to 120 volts. Then, the DC/DC voltage conversion unit 112 converts the rectified DC voltage to the intermediate DC voltage, which may be, for example, 48 volts. The DC/DC converter output modules 104*a-i* receive the intermediate DC voltage, via the intermediate DC voltage bus 120, and convert the received DC voltage to the voltage used by loads 106*a-i*. Examples of load voltages may be 12.5 volts DC, 5 volts DC or 3.5 volts DC, as illustrated in Brooks et al.

AC power flowing into the metered front end rectifier 100 is metered by the meter circuit 108. Meter circuit 108 comprises, in one embodiment, components that are electromagnetically coupled to connection 116, graphically illustrated by the dashed-line 128. AC current and voltage are detected such that AC power flowing into the metered front end rectifier 100 can be determined. Information corresponding to the metered power may be determined on an energy basis and/or determined on a demand basis.

Figure 2:
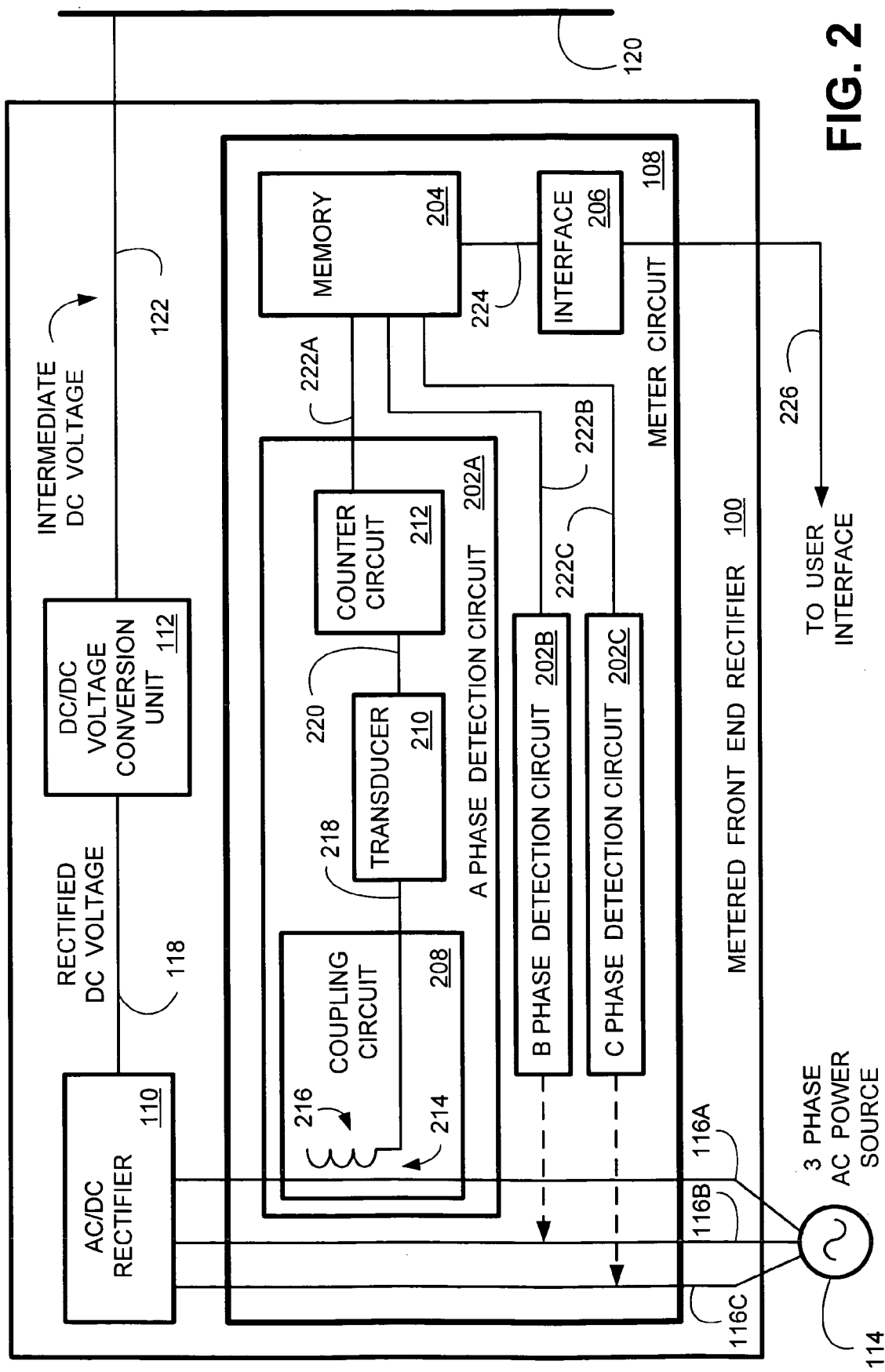
FIG. 2 is a block diagram illustrating an exemplary meter circuit residing in an embodiment of a metered front end rectifier.

FIG. 2 is a block diagram illustrating an exemplary meter circuit 108 residing in an embodiment of a metered front end rectifier 100. The exemplary meter circuit 108 is, in this embodiment, metering three phase power received from the AC power source 114. A three phase AC power source, well known in the arts, provides sinusoidal AC voltage and current on phase A (via connection 116A), phase B (via connection 116B) and phase C (via connection 116C). The voltage/current on phases A, B and C are electrically separated by 120 degrees. The AC/DC rectifier 110 converts the AC voltage and current received from the A, B and C phases into the DC rectified voltage and current, which is then combined and output onto the single connection 118.

Accordingly, the exemplary meter circuit 108 illustrated in FIG. 2 comprises an A phase detection circuit 202A, a B phase detection circuit 202B, a C phase detection circuit 202C, a memory 204 and an interface 206. For convenience, exemplary circuits in the A phase detection circuit 202A are illustrated in further detail.

The A phase detection circuit 202A comprises a coupling circuit 208, a transducer 210 and a counter circuit 212. The B phase detection circuit 202B and the C phase detection circuit 202C would be similarly configured.

Coupling circuit 208 is electrically coupled to the connection 116A at region 214. For example, one or more inductors 216 may provide coupling such that at least the AC current flowing over connection 116A can be detected. Accordingly, an AC analog signal is generated and output onto connection 218 that is proportional to the detected A phase, AC current.

Transducer 210 receives the proportional AC signal on connection 218, and generates a digital pulse signal having a frequency that is proportional to the received AC signal. Transducer 210 outputs the digitized pulse signal onto connection 220.

Counter circuit 212 counts the number of pulses received from the transducer 210 during a predefined time interval. Counter circuit 212 then outputs information corresponding to the number of counted pulses per time interval onto connection 222A such that the information corresponding to the detected A phase, AC current is stored in memory 204.

The information corresponding to the detected A phase, AC current may be used to compute the A phase, AC power flowing over connection 116A (if value of AC voltage is assumed). In another embodiment, the coupling circuit 208 has additional components to detect AC voltage. For example, another transducer and counter circuit (not shown) may be used to provide information corresponding to the detected A phase, AC voltage that is stored in memory 204. Thus, actual AC voltage may be used to more accurately compute AC power flowing over connection 116A.

Alternatively, the components of the A phase detection circuit 202A could be configured to generate and communicate information corresponding to actual AC power flowing over connection 116A. That is, the internal components could be configured to concurrently detect AC current and AC voltage such that AC power information is directly generated.

B phase detection circuit 202B and the C phase detection circuit 202C similarly provide information corresponding to the AC power, voltage and/or current on their respective connections 116B and 116C into memory 204. Thus, information corresponding to total AC power flowing from the AC power source 114 into the metered front end rectifier 100 is determinable.

Once the information corresponding to the AC power, voltage and/or current is saved into memory 204, the information is communicated out of the metered front end rectifier 100 to another system such that the information may be used. Accordingly, an interface 206 is provided that is configured to receive the information from memory 204, via connection 224, and communicate the received information to a remotely located user interface (not shown), via connection 226. This user interface may be a component residing within the enclosure 102 (FIG. 1) or may be a separate system, such as a processor based system. Any suitable interface 206 configured to communicate information corresponding to the metered power to a user interface may be used by the various embodiments.

The above-described components of meter circuit 108 are intended to illustrate various alternative metering components that could be used to determine the AC power flowing from the AC power source 114 into the metered front end rectifier 100. These components, or other components (not shown), could be configured differently without departing from the features of the present invention. For example, a combiner circuit (not shown) could be used to aggregate the information from the A, B and C phase detection circuits 202A-C such that the total AC power information is saved into memory 204. Furthermore, many of the functions described above to detect and/or determine AC power, voltage and/or current could be performed by a state machine-based device or a processor-based system. Also, the exemplary embodiment is configured for metering three-phase power, voltage and/or current. Other embodiments may be configured to meter single and/or two phase power, voltage and/or current.

Furthermore, the memory 204 and interface 206 may not be included in some embodiments. For example, the information from the A, B and/or C phase detection circuits 202A-C may be directly communicated to a remote system that stores and further process the information. Or, the metered power information may be communicated to another memory residing in the enclosure.

Figure 3:
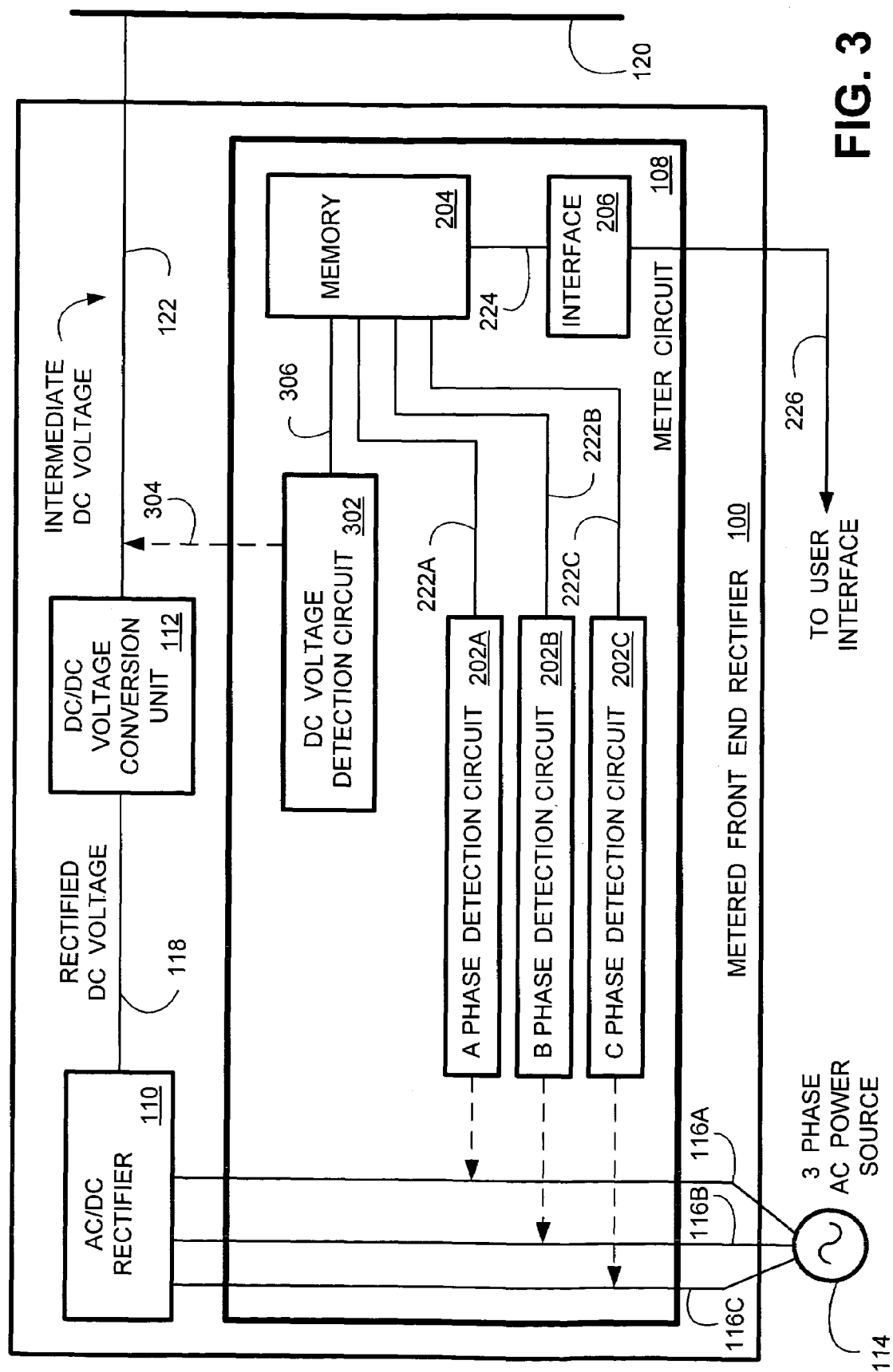
FIG. 3 is a block diagram illustrating another exemplary meter circuit residing in an embodiment of a metered front end rectifier.

FIG. 3 is a block diagram illustrating another exemplary meter circuit 108 residing in an embodiment of a metered front end rectifier 100. In addition to having the above-described components for determining AC power, voltage and/or current information, this embodiment further comprises a DC voltage power detection circuit 302. The DC voltage power detection circuit 302 detects the DC current/and or voltage on connection 122 (generally indicated by the dashed-line 304) and then outputs the information for storage in memory 204, via connection 306. By comparing the determined total AC power on connections 116A-C and the DC power on connection 122, information may be determined regarding power consumed by the AC/DC rectifier 110 and/or the DC/DC voltage conversion unit 112. Thus, the DC voltage power detection circuit 302 meters power flowing out of the DC/DC conversion unit 112.

Alternatively, the DC voltage power detection circuit 302 may detect the DC current/and or voltage on connection 118. Or, the DC voltage power detection circuit 302 may detect the DC current and/or voltage on connections 118 and 122. Yet another DC voltage power detection circuit 302 may be separately included to detect the current and/or voltage on connection 118. Such embodiments provide greater flexibility in monitoring power at various points in the metered front end rectifier 100.

Figure 4:
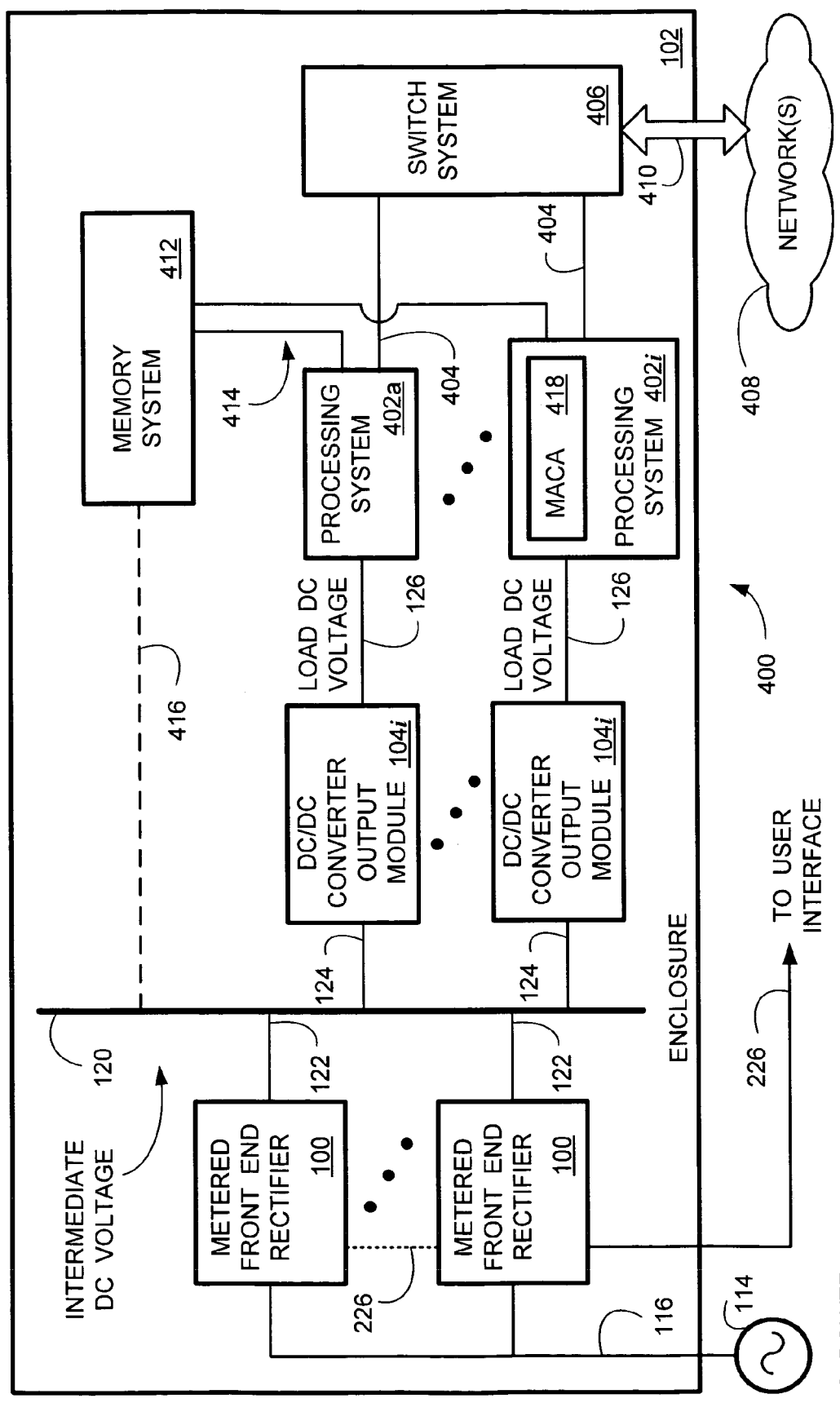
FIG. 4 is a block diagram illustrating embodiments of a metered front end rectifier residing in a server system enclosure.

FIG. 4 is a block diagram illustrating embodiments of a metered front end rectifier 100 residing in a server system 400 enclosure 102. Here, for convenience, a plurality of metered front end rectifiers 100 source the intermediate DC voltage bus 120 (although a single metered front end rectifier 100 could be used). The components residing in enclosure 102 correspond to typical components that may be found in various server systems. For this example, processing systems 402a-i are configured to provide a control signal, via connections 404, to the switch system 406 for the routing of communications through the server system 400. Accordingly, the switch system 406 is coupled to one or more networks 408, via connection path 410. It is understood that any suitable type of network 408 may couple to the switch system 406. Further, network(s) 408 may be multiple, separate networks of different types. Thus, the components residing in the switch system 406 may vary depending upon the nature of the network(s) 408 to which it is coupled to, and may vary the types of communications that are passing across the network(s) 408 via switch system 406.

Server system 400 may employ a memory system 412 that provides information that is used to establish switchable routes through the switch system 400. Thus, in this simplified exemplary embodiment, the processing systems 402a-i access the memory system 412, via connections 414, as needed to determine and/or establish the routes. That is, communication routes through the switch system 406 may be configured by the processing systems 402a-i based upon information residing in the memory system 412.

Memory system 412 may have various components, including suitable memory elements, that require power for operation. Thus, memory system 412 may be coupled directly to, or via intermediary components (not shown), to the intermediate DC voltage bus 120 (illustrated by connection 416).

Power consumed by the components residing in the memory system 412 will vary, in part, depending upon the frequency and type of access by the processing systems 402a-i which access the memory system 412. The processing systems 402a-i access the memory system 412 based upon the various memory access control algorithms and the configuration of components residing in the processing systems 402a-i. Accordingly, the frequency and/or type of access to the memory system 412 by the processing systems 402a-i may be controlled by a memory access control algorithm (MACA) 418.

Exemplary ways to limit power include varying the clock frequency for the memory subsystem and/or how much of the memory can be accessed simultaneously. The slower the frequency and the less memory accessed simultaneously will lower the power consumed by the memory. Another technique is page-mode versus non page-mode access. Page-mode is faster, but also consumes more power. Other techniques are equally applicable.

In some server systems 400, it is possible to modify the memory access control algorithms 418 to change the frequency and type of access by the processing systems 402a-i accessing the memory system 412. Accordingly, such changes may affect power consumption within the memory system 412 and/or the processing systems 402a-i. It is appreciated that there is a trade-off between fast and/or more frequent access to the memory system 412 and power consumption. That is, slower access and/or less frequent access requires relatively less power. Faster access and/or more frequent access requires relatively more power.

Since embodiments of the metered front end rectifiers 100 are configured to meter power, and then to provide that information to a user interface, changes in power consumption can be monitored. When changes in power consumption are caused from modifications to the memory access control algorithms 418 which change the frequency and type of access by the processing systems 402a-i accessing the memory system 412, changes in power consumed by the server system 400 may be metered, determined and attributed to the algorithm 418 modifications.

Accordingly, after the server system 400 residing in enclosure 102 has been installed and placed in service, the impact of program modifications can be determined without the need to take the server system 400 out of service to perform individual tests on individual components.

Figure 5:
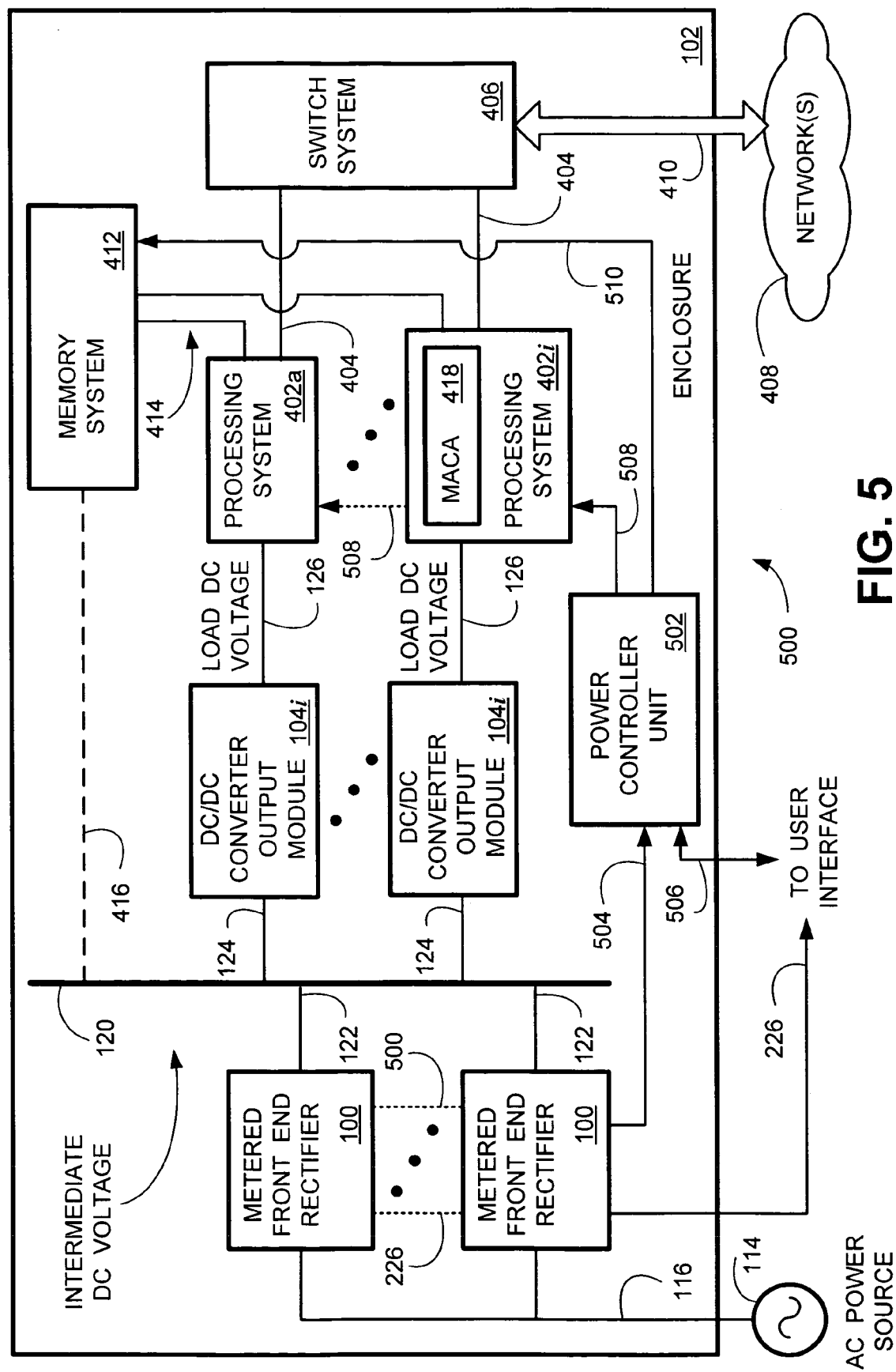
FIG. 5 is a block diagram illustrating other embodiments of a metered front end rectifier residing in a server system enclosure that employs a power controller unit.

FIG. 5 is a block diagram illustrating another embodiment of a metered front end rectifier 100 residing in a server system 500 that employs a power controller unit 502. As noted above, the frequency and type of access by the processing systems 402a-i accessing the memory system 412 may be controlled by the memory access control algorithms 418. In this embodiment, a power controller unit 502 is configured to receive information corresponding to the metered power consumption in the server system 500 by receiving metered power information (energy and/or demand information) from the metered front end rectifiers 100, via connection(s) 504. Thus, changes in total power consumption can be monitored. In one embodiment, the interface 206 (FIG. 2) may be coupled to the power controller unit 502 such that information corresponding to the metered power may be communicated to the power controller unit.

The power controller unit 502 is further configured to communicate with the user interface, via connection 506. Accordingly, a predefined value of total metered energy and/or demand may be specified for the server system 500 residing in enclosure 102. The power controller unit 502 monitors the actual total metered energy and/or demand and compares the total with a specified metered energy and/or demand. When total metered energy and/or demand exceeds the specified value(s), the power controller unit 502 may communicate information to the processing systems 402a-i, via connections 508, thereby causing modification of the memory access control algorithms 418 to decrease the frequency and/or change the type of access by the processing systems 402a-i to the memory system 412 such that the total energy and/or demand is reduced.

When changes of power consumption are caused by modifications to the memory access control algorithms 418 (e.g., which change the frequency and/or type of access by the processing systems 402a-i accessing the memory system 412), such changes may be determined and attributed to the modifications. Thus, if power (energy and/or demand) consumed by the components residing in the enclosure 102 needs to be reduced, then power controller unit 502 may reduce total energy and/or demand by communicating information to the processing systems 402a-i which causes modification of the memory access control algorithms 418 (thereby changing or modifying the frequency and/or type of access by the processing systems 402a-i to the memory system 412).

On the other hand, it may be desirable to provide faster memory access and/or more frequent memory access to the processing systems 402a-i. For example, the total power consumption (energy and/or demand) may be less than the specified values for the server system 500. When the actual metered power consumption (energy and/or demand) is less than or equal to some margin (a predetermined value of power, energy and/or demand less that the maximum amount allowed) within the enclosure 102, then the power controller unit 502 may communicate information to the processing systems 402a-i to cause the modification of the memory access control algorithms 418 to increase the frequency and/or change the type of access by the processing systems 402a-i to the memory system 412. Such changes improve operating efficiency of the server system 500. Here, the total energy and/or demand might be increased up to the predefined values.

In some embodiments, the power controller unit 502 may communicate information to components residing in memory system 412, via connection 510. For example, memory system 412 may itself have a processor which regulates various functions and/or operations of the memory system 412.

Changes which affect energy and/or demand of the memory system 412, or its components, may be determined by the power controller unit 502.

Furthermore, the total energy and/or demand consumed by other components residing within enclosure 102 may be controlled. That is, changes in various control algorithms and/or operation of other components may be made on an as-needed basis to control total power energy and/or demand, and to control operating efficiency of the server system 500. That is, information corresponding to the metered power is communicated to the power controller unit 502 from the metered front end rectifier 100. The power controller unit 502 adjusts operation of at least one component based upon the received metered power information to either increase power use or decrease power use based upon a predefined value of consumed power.

The above-described process of controlling or modifying the memory access control algorithms 418 to increase the frequency and/or change the type of access by the processing systems 402a-i to the memory system 412 is provided as a possible exemplary application of the above-described embodiment. Similar process may be used in other types of systems by alternative embodiments. For example, there may be a plurality of memories residing in the enclosure, such as when each of the processing systems 402a-i have their own memory devices residing within them. Or, the components residing within the enclosure may perform a function different than the above server system 500 which facilitates communication over network(s) 408. Or, the operation of other components (not shown) may be modified by the power control unit 502 to adjust consumed energy and/or demand. In such alternative embodiments, the processes may be similar to the above-described process of modifying of the memory access control algorithms 418 to change the frequency and/or change the type of access by the processing systems 402a-i to the memory system 412.

The above-described power controller unit 502 may be any suitable controller, control circuit or control system. It may employ a processor-based system, may be a state machine, or a combination system. Memories may be employed that may store the various memory access control algorithms 418, may direct the downloading of the memory access control algorithms 418 from a remote source, or may cause different versions of the memory access control algorithms 418 residing in the processing systems 402a-i to be selected for execution. Since the power controller unit 502 is described with sufficient functionality for one skilled in the art to make, practice and use this component, and since the various forms of a power controller unit 502 are so numerous that describing the many possible constructs is not practical, specific details regarding the various possible constructions of the power controller unit 502 is not provided herein. All such various possible constructions of the power controller unit 502 are intended to be included herein within the scope of this disclosure.

Figure 6:
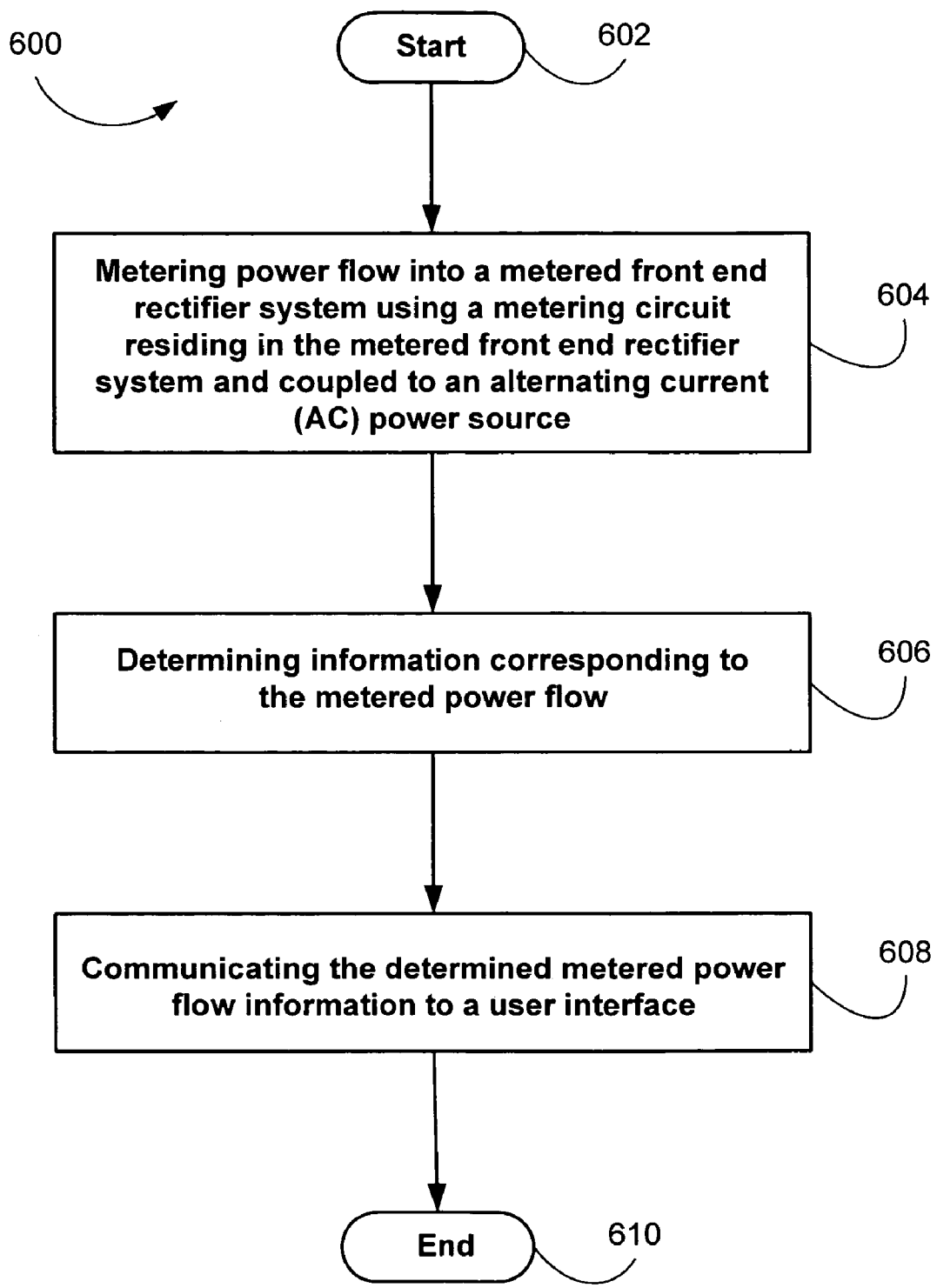
FIG. 6 is a flowchart illustrating a process used by an exemplary embodiment of a metered front end rectifier.

FIG. 6 is a flowchart 600 illustrating an exemplary process used by an embodiment of a metered front end rectifier 100. The process starts at block 602. At block 604, power flow into a metered front end rectifier system is metered using a metering circuit residing in the metered front end rectifier system and coupled to an alternating current (AC) power source. At block 606, information corresponding to the metered power flow is determined. At block 608, the determined metered power flow information is communicated to a user interface. The process ends at block 610.

It should be emphasized that the above-described embodiments are merely examples of the disclosed systems and methods. Many variations and modifications may be made to the above-described embodiments. All such modifications and variations are intended to be included herein within the scope of this disclosure.

What is claimed is:

1. A system, comprising:
    a metered front end rectifier system, further comprising:
        an alternating current to direct current (AC/DC) rectifier coupled to an AC power source that converts received AC power to DC power at a rectified DC voltage;
        a modular direct current to direct current (DC/DC) conversion unit coupled to the AC/DC rectifier and to an intermediate DC voltage bus that converts power received at the rectified DC voltage to an intermediate DC voltage; and
        a meter circuit configured to meter power flowing from the AC power source to the AC/DC rectifier, the meter circuit having a coupling circuit, a transducer, a counter circuit and a memory, the coupling circuit being electromagnetically coupled to the power flowing from the AC power source and being operative to generate an AC analog signal corresponding to at least one of current and voltage of the power flowing, the transducer being operative to convert the AC analog signal into a digitized pulse signal, the counter circuit being operative to count a number of pulses of the digitized pulse signal during a predefined time interval, the memory being operative to store information corresponding to the number of pulses counted during the predefined time interval;
    a memory system that stores information pertaining to the operation of the system;
    at least one processing system coupled to the memory system, wherein the processing system accesses the memory system using a modifiable memory access control algorithm which controls memory access functions; and
    a power controller unit coupled to the processing system and the metered front end rectifier system, wherein the information corresponding to the metered power is communicated to the power controller unit from the metered front end rectifier system, and wherein the power controller unit adjusts operation of the processing system based upon the received metered power information to either increase power use or decrease power use based upon a predefined value of consumed power.

2. The system of claim 1, wherein the memory access control algorithm is modified to change the frequency of access to the memory system by the processing system.

3. The system of claim 1, wherein the memory access control algorithm is modified to change the type of access to the memory system by the processing system.

4. The system of claim 1, further comprising a switch system coupled to at least one network such that communication routes through the switch system may be configured by the processing system based upon the information residing in the memory system.

5. A metered front end rectifier system for use with an AC power source and an intermediate DC voltage bus, said metered front end rectifier system comprising:
    an alternating current to direct current (AC/DC) rectifier coupled to an AC power source, the AC/DC rectifier being operative to convert received AC power to DC power at a rectified DC voltage;
    a modular direct current to direct current (DC/DC) conversion unit coupled to the AC/DC rectifier and to an intermediate DC voltage bus, the modular DC/DC conversion unit being operative to convert power received at the rectified DC voltage to an intermediate DC voltage; and a meter circuit configured to meter power flowing from the AC power source to the AC/DC rectifier, the meter circuit comprising:

a detection circuit operative to detect voltage and current on a phase conductor of the AC power source:

a coupling circuit electromagnetically coupled to the phase conductor and operative to generate an AC analog signal corresponding to phase voltage and current;

a transducer coupled to the coupling circuit and operative to convert an AC analog signal corresponding to the phase voltage and current into a digitized pulse signal:

a counter circuit coupled to the transducer and operative to count a number of pulses of the digitized pulse signal during a predefined time interval; and a memory coupled to the counter circuit and operative to store information corresponding to the number of pulses counted during the predefined time interval.

6. The system of claim 5, wherein the DC voltage power detection circuit is operative to meter DC power within the metered front end rectifier system.

7. The system of claim 5, wherein the meter circuit further comprises an interface configured to communicate information corresponding to the metered power to a user interface.

8. The system of claim 5, further comprising a connector to the interface that may be coupled to a power controller unit such that information corresponding to the metered power may be communicated to the power controller unit, wherein the power controller unit adjusts operation of at least one other component based upon the received information.

9. The system of claim 5, wherein the meter circuit further comprises means for communicating information corresponding to the metered power to a user interface.

10. The system of claim 5, wherein the coupling circuit comprises an inductor operative to detect AC current.

11. A system comprising:
an AC power source;
a metered front end rectifier system electrically coupled to the AC power source; and
an intermediate DC voltage bus electrically coupled to the metered front end rectifier system;
the metered front end rectifier system having an alternating current to direct current (AC/DC) rectifier operative to convert received AC power to DC power at a rectified DC voltage and a meter circuit operative to meter power flowing from the AC power source to the AC/DC rectifier, the meter circuit comprising:

a detection circuit operative to detect at least one of voltage and current on a phase conductor of the AC power source;

a coupling circuit electromagnetically coupled to the phase conductor and operative to generate an AC analog signal corresponding to at least one of phase voltage and current;

a transducer operative to convert the AC analog signal into a digitized pulse signal;

a counter circuit operative to count a number of pulses of the digitized pulse signal during a predefined time interval; and a memory operative to store information corresponding to the number of pulses counted during the predefined time interval.

12. The system of claim 11, wherein the metered front end rectifier system further comprises a modular direct current to direct current (DC/DC) conversion unit electrically connected between the AC/DC rectifier and the intermediate DC voltage bus, the modular DC/DC conversion unit being operative to convert power received at the rectified DC voltage to an intermediate DC voltage.

13. The system of claim 12, wherein the metered front end rectifier system further comprises a DC voltage detection circuit operative to detect the intermediate DC voltage.

14. The system of claim 12, wherein the DC voltage detection circuit is electromagnetically coupled between the AC/DC rectifier and to the intermediate DC voltage bus.

15. The system of claim 11, wherein the coupling circuit comprises an inductor operative to detect AC current.

16. The system of claim 11, further comprising:
a memory system operative to store information pertaining to operation of the system;
a processing system operative to access the memory system using a modifiable memory access control algorithm; and
a power controller unit operative to adjust operation of the processing system based, at least in part, upon received metered power information and a predefined value of consumed power.

* * * * *

UNITED STATES PATENT AND TRADEMARK OFFICE
CERTIFICATE OF CORRECTION

| | | |
|---|---|---|
| PATENT NO. | : 7,502,699 B2 | Page 1 of 1 |
| APPLICATION NO. | : 11/193689 | |
| DATED | : March 10, 2009 | |
| INVENTOR(S) | : Robert A. Guenther et al. | |

It is certified that error appears in the above-identified patent and that said Letters Patent is hereby corrected as shown below:

In column 11, line 7, in Claim 5, delete "source:" and insert -- source; --, therefor.

In column 11, line 13, in Claim 5, delete "signal:" and insert -- signal; --, therefor.

Signed and Sealed this

Eleventh Day of August, 2009

David J. Kappos
*Director of the United States Patent and Trademark Office*